United States Patent
Broze et al.

(10) Patent No.: US 11,050,240 B2
(45) Date of Patent: Jun. 29, 2021

(54) ELECTRIC MOTOR GROUND PROTECTION

(71) Applicant: TEXAS INSTRUMENTS INCORPORATED, Dallas, TX (US)

(72) Inventors: John R. Broze, Fate, TX (US); Garret R. Walker, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 147 days.

(21) Appl. No.: 16/256,646

(22) Filed: Jan. 24, 2019

(65) Prior Publication Data

US 2019/0305544 A1 Oct. 3, 2019

Related U.S. Application Data

(60) Provisional application No. 62/651,828, filed on Apr. 3, 2018.

(51) Int. Cl.
*H02K 7/08* (2006.01)
*H02K 11/40* (2016.01)
*H02H 5/10* (2006.01)
*G01R 31/50* (2020.01)
*H02H 7/08* (2006.01)

(52) U.S. Cl.
CPC ........... *H02H 7/0844* (2013.01); *G01R 31/50* (2020.01); *H02H 5/105* (2013.01); *H02H 7/0838* (2013.01); *H02K 11/40* (2016.01)

(58) Field of Classification Search
CPC .... H02H 7/0844; H02H 5/105; H02H 7/0838; H02K 11/40; G01R 31/50
USPC ........................................................ 318/434
See application file for complete search history.

(56) References Cited

U.S. PATENT DOCUMENTS

| 9,124,094 | B2* | 9/2015 | Beck | H02H 3/33 |
|---|---|---|---|---|
| 10,355,581 | B2* | 7/2019 | Guven | H02M 7/5387 |
| 2004/0217724 | A1* | 11/2004 | Nagasawa | H02P 7/04 |
| | | | | 318/280 |
| 2006/0220682 | A1* | 10/2006 | Satou | H03K 3/356113 |
| | | | | 326/80 |
| 2007/0216469 | A1* | 9/2007 | Sakamoto | H03K 17/063 |
| | | | | 327/519 |
| 2010/0053831 | A1* | 3/2010 | Camacho Sosa-Dias | |
| | | | | H02H 3/22 |
| | | | | 361/91.5 |
| 2011/0102962 | A1* | 5/2011 | Tanaka | H01L 27/0251 |
| | | | | 361/212 |
| 2012/0275070 | A1* | 11/2012 | Sicard | H02H 5/105 |
| | | | | 361/42 |
| 2013/0100557 | A1 | 4/2013 | Lin | |

OTHER PUBLICATIONS

International Search Report in corresponding PCT Application No. PCT/US2019/025603, dated Jun. 20, 2019 (2 pages).

* cited by examiner

*Primary Examiner* — Muhammad S Islam
*Assistant Examiner* — Devon A Joseph
(74) *Attorney, Agent, or Firm* — Ray A. King; Charles A. Brill; Frank D. Cimino

(57) ABSTRACT

A circuit for ground disconnection protection is provided herein. In an embodiment, the circuit includes power transistor elements in a common-source arrangement coupled between a first ground and a second ground. The power transistor elements are configured to turn on during a ground disconnection event in an electric motor system. This allows a current to pass between the first ground and the second ground, bypassing a control circuit.

14 Claims, 5 Drawing Sheets

ELECTRIC MOTOR GROUND PROTECTION

RELATED APPLICATIONS

This application hereby claims the benefit of and priority to U.S. Provisional Patent Application No. 62/651,828, titled "GND Disconnection Protection for Motor Drive Applications with Extended Common Mode Range", filed on Apr. 3, 2018 and which is hereby incorporated by reference in its entirety.

TECHNICAL BACKGROUND

Electric motor systems typically include various electronics to control and monitor operation of the motors. For example, direct current (DC) motors employ control electronics to direct current to and from motor windings, which might take the form of various circuit topologies. One example, topology, the half-bridge power stage topology is used to control different DC motor types. These half-bridge topologies can include H-bridge, triple half-bridge, and dual H-bridge types, among others. Challenges can arise when using these topologies due to usage of switching elements, such as power metal oxide semiconductor field-effect transistor (MOSFETs).

In other examples, the half-bridge power stage topology is controlled by control circuitry. This control circuitry drives the gates of the power stage transistors in order to control the current flow through the various motor windings of the motors. While the power stage is constructed to be able to handle the large currents required by the motors, the control circuitry is not.

Overview

A circuit for ground disconnection protection is provided herein. In an example, the circuit includes power transistor elements in a common-source arrangement coupled between a first ground and a second ground. The power transistor elements are configured to turn on during a ground disconnection event in an electric motor system. This allows a current to pass between the first ground and the second ground, bypassing a control circuit.

In another example, a circuit for ground disconnection protection in an electric motor is provided. The circuit includes power metal oxide semiconductor field-effect transistors (MOSFETs) in a common-source arrangement coupled between a first ground and a second ground, configured to turn on during a ground disconnection event in an electric motor system, allowing a current to pass between the first ground and the second ground, the current bypassing a control circuit.

BRIEF DESCRIPTION OF THE DRAWINGS

While several implementations are described in connection with these drawings, the disclosure is not limited to the implementations disclosed herein. On the contrary, the intent is to cover all alternatives, modifications, and equivalents.

DETAILED DESCRIPTION

Figure 1:
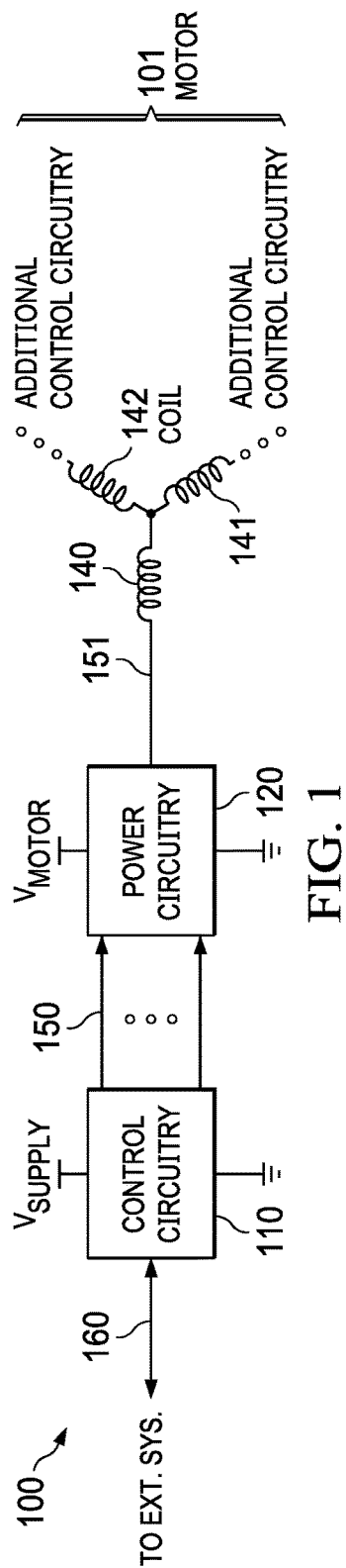
FIG. 1 illustrates a motor system in an example implementation.

As discussed above, electric motor systems include both power circuitry and control circuitry used in the control of current to the several electrical coils found within an electric motor. In at least one example, the power circuitry includes high-power components designed to source and sink large currents through the electrical coils in a controlled manner in order to operate the electric motor as desired. The power circuitry is controlled by multiple signals provided by control circuitry. These signals are configured to turn on and off the high-power components within the power circuitry in a controlled fashion in order to operate the electric motor.

In other examples, the power circuitry is provided in close proximity to the electric motor, while the control circuitry is situated on a separate board or module and linked to the power circuitry via several electrical connections. In additional examples, the power circuitry and control circuitry have separate voltage sources and reference potentials (grounds). In at least one alternative, the power circuitry and control circuitry may be connected to the same voltage source, but have separate grounds which are coupled together through one or more of the electrical connections between the control circuitry and the power circuitry.

In normal operation, the grounds are linked together and remain at the same potential. However, when motors and their controllers are in actual use, it is possible for one of the grounds to be disconnected due to vibration or other forces. In such a ground disconnection event in one of the grounds, the electrical connections and the control circuitry may be subjected to the large currents from the power circuitry. For example, if the ground to the power circuitry becomes disconnected, the large currents flowing through the power circuitry attempt to flow through the control circuitry to the ground of the control circuitry. The control circuitry is not configured to handle these large currents, and is destroyed.

By providing ground disconnection protection circuitry between the two (or more) grounds, the control circuitry may be protected from these large currents. In an example, ground disconnection protection circuitry is configured to pass current between the two ground nodes when a voltage differential between the two ground nodes exceeds a threshold. In various examples the threshold is between $V_{diode}$ (about 0.7V) and about 4V. This voltage differential is termed the common mode range of the circuit. When the voltage differential exceeds the threshold (or common mode range of the circuit) ground disconnection protection circuits are activated to protect the control circuitry from large currents. Various ground disconnection protection circuits are described herein, some including extended common mode range.

Examples described herein provide wide common mode range while maintaining isolation of the control circuitry from the power circuitry. Motor current from the power stage must not bleed into the low power ground for reliability and electromagnetic interference (EMI) concerns. These examples also provide protection from ground disconnection during operation since damage to the control circuitry (or any other device) is not acceptable, especially in automotive and safety applications.

Previous solutions included a pair of back-to-back high-power diodes placed between the ground terminals on the printed circuit board (PCB). This pair of diodes provided a common mode range of $V_{diode}$ or about 0.7V. In order to extend the common mode range, additional high-power diodes were placed in series with each of the pair of back-to-back diodes with each additional pair of high-power diodes adding $V_{diode}$ or about 0.7V to the common mode range. Thus, placing four series high-power diodes in a back-to-back configuration (requiring a total of eight high-power diodes), a common mode range of approximately $4 \times V_{diode}$ or about 2.8V may be achieved. However, these high-power diodes are expensive and require large amounts of space on the PCB, resulting in a less than desirable solution.

Motor control systems are discussed herein, which can be employed to control direct current (DC) motors, among other elements. Depending on the type of motor and configuration, one or more motor windings might be provided within a motor. Motor windings are employed in motors to provide rotary or linear motion, and these windings may include wire coils, which are referred to herein as motor phases. Control systems control distribution of electrical current to and from motor windings. One example control circuit topology, a half-bridge power stage, includes control circuitry as well as power switching elements. These power switching elements can include metal oxide semiconductor field-effect transistor (MOSFETs), insulated-gate bipolar transistors (IGBTs), or thyristors, among other switching elements. Although the disclosed motor control circuitry discussed herein employs power MOSFETs, the disclosed circuitry can be applied to control other types of switching elements.

As a first example of motor control circuitry, FIG. 1 is provided. FIG. 1 illustrates system 100 which provides power to one or more phase windings 140-142 (referred to as phases) of motor 101. System 100 includes control circuitry 110, power circuitry 120, and motor 101. Control circuitry 110 can communicate over link 160 with one or more external systems, such as to provide a programming interface for elements of system 100. In operation, control circuitry 110 instructs power circuitry 120 over one or more links 150 to switch current for motor phase 120. Power circuitry 120 thus provides electrical power over link 151 as sourced from $V_{MOTOR}$ to motor phase 120 as a portion of motor 101. Further control circuitry and power circuitry can be included for additional phases 141-142 of motor 101, or these phases might be controlled by elements of system 100.

Power for control circuitry 110 is sourced from $V_{SUPPLY}$. In the illustrated example, control circuitry 110 is of lower power compared to power circuitry 120, and has a separate ground from the power circuitry 120. These grounds are typically coupled together through one of links 150. Control circuitry 110 includes one or more processing elements and control circuits to instruct power control circuitry 120 to selectively source or sink current from phase 140 over link 151. Control circuitry 110 determines control voltages or control signals which couple to gate terminals of power transistor elements of power control circuitry 120.

Control circuitry 110 can be implemented using various microprocessors, control logic, programmable logic devices, discrete logic devices, or other devices and elements. Control circuitry 110 can also include gate driver circuitry which drives the gate terminals of the power transistor elements. This driver circuitry can include power amplifiers, gate drive transformers, DC-DC converter elements, or other circuit components to provide sufficient voltages to control gate terminals of associated power transistor elements.

Power circuitry 120 includes power transistor elements which act as power switching elements with regard to a motor phase, such as phase 140. Switching elements of power circuitry 120 are coupled between a voltage source, indicated in FIG. 1 as $V_{MOTOR}$, and a reference potential (or ground). Although various transistor circuit topologies might be employed by power circuitry 120, the examples herein include half-bridge topologies. Half-bridge power stage topologies can be used to control different motor types, such as DC motors. These half-bridge topologies can include H-bridge, triple half-bridge, and dual H-bridge types, among others. Typically, a half-bridge power stage includes two switching elements, such as power transistors, arranged to have a first (high-side) switching element and a second (low-side) switching element coupled at a common output node. This common output node is shown as link 151 in FIG. 1, although various passive circuit elements might be positioned between the common output node and link 151. The first switching element also couples to the voltage source, while the second switching element also couples to the reference potential.

In the examples herein, the switching elements includes power metal oxide semiconductor field-effect transistor (MOSFETs). Specifically, n-channel power MOSFETs are employed due to the lower on-resistance than p-channel power MOSFETS. Power MOSFETs includes gate terminals, drain terminals, and source terminals for connection to external components. Additionally, power MOSFETs include "body diode" components which result from the structural formation of semiconductor connections internal to each power MOSFET. These body diode components or elements might continue to conduct current after a corresponding power MOSFET has been switched into an 'off' or inactive state. A further discussion of the operation of body diode components is found in FIG. 3 below.

Half-bridge power stage topologies can employ first (high-side) and second (low-side) power MOSFET devices. A first power MOSFET is coupled at a drain terminal to the voltage source ($V_{MOTOR}$), while a source terminal is coupled to the common output node of power circuitry 120. A second power MOSFET is coupled at a source terminal to the reference potential (e.g. electrical ground), while a drain terminal is coupled to the common output node of power circuitry 120. Gate terminals of the first MOSFET and second MOSFET are coupled via one or more links 150 to gate driver elements of control circuitry 110. Various passive or active circuit components might be provided in power circuitry 120 to support operation of the power MOSFETs, such as resistors, capacitors, inductors, voltage limiters, diodes, logic gates, or other elements.

Figure 2:
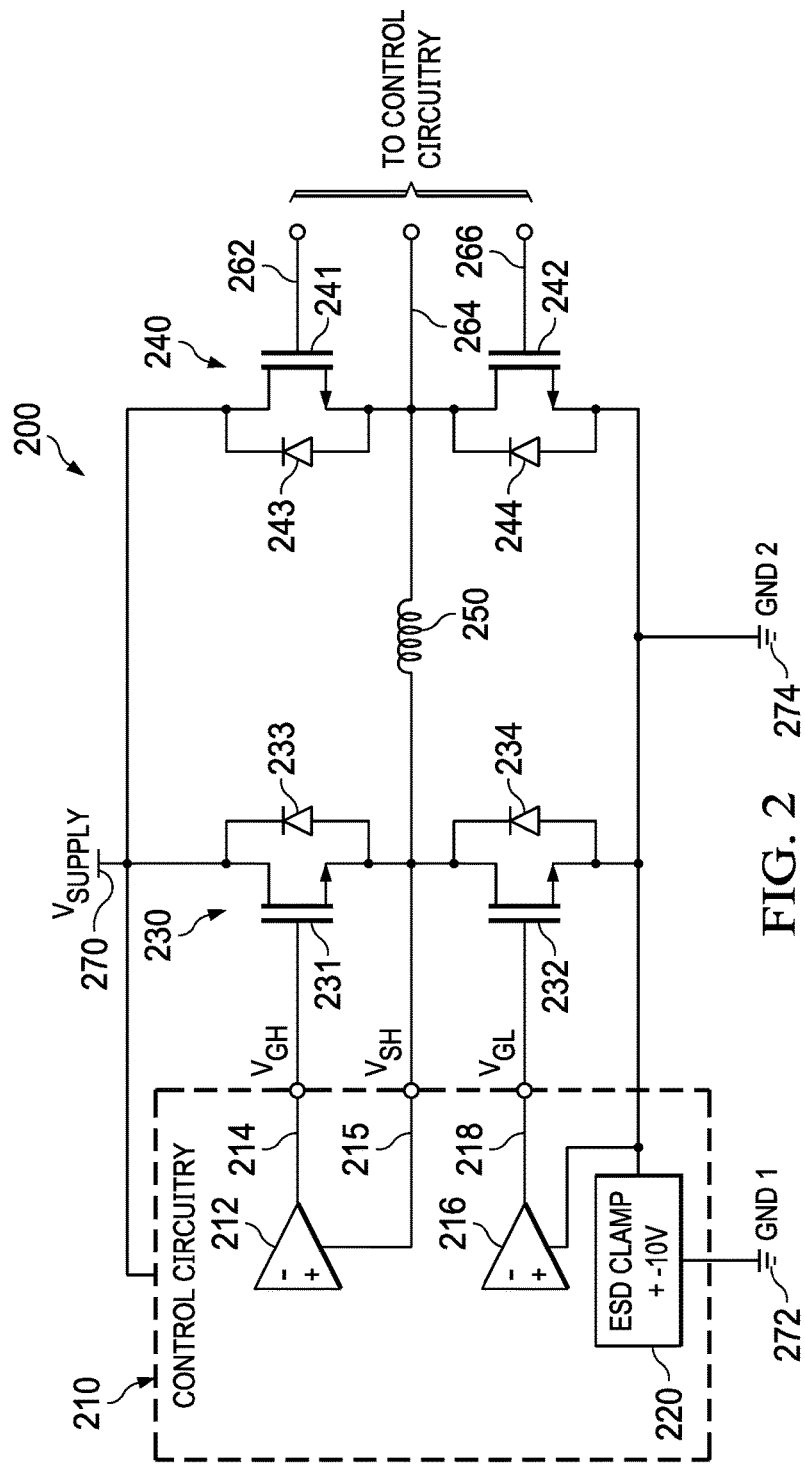
FIG. 2 illustrates a motor power control system in an example implementation.

Turning now to a specific implementation of control circuitry 110 and power circuitry 120, FIG. 2 is presented. FIG. 2 includes power switching circuit 200 as an example of power circuitry 120, and control circuitry 210 as an example of control circuitry 110, although variations are possible. Circuit 200 includes two half-bridge topologies 230 and 240 each formed by two power MOSFET devices. Half-bridge 230 is formed by MOSFET devices 231 and 232 including their body diodes 233 and 234 respectively. Half-bridge 240 is formed by MOSFET devices 241 and 242 including their body diodes 243 and 244 respectively.

In this example, both control circuitry 210 and power circuitry 200 are provided power from $V_{SUPPLY}$ 270, however, control circuitry 210 uses GND 1 272 (first ground) as a reference potential while power circuitry 200 uses GND 2 274 (second ground) as a reference potential. This configuration of separate grounds is typically due to instances where control circuitry 210 and power circuitry 200 are physically separate, such as on different circuit boards. However, note that GND 1 272 (first ground) and GND 2 274 (second ground) are electrically coupled through ESD Clamp 220. In other versions, control circuitry 210 and power circuitry 200 are provided power from separate power sources. In the illustrated example, ESD Clamp 220 is configured to connect GND 2 274 (second ground) to GND 1 272 (first ground) whenever the voltage difference between the two reference potentials exceeds 10 volts. This voltage differential is referred to as common mode range.

MOSFET device 231 is the "high-side" (HS) device of half-bridge 230, while MOSFET device 232 is the "low-side" (LS) device of half-bridge 230. Each power MOSFET device also has a corresponding body diode 233 and 234. First MOSFET device 231 is coupled at a drain terminal to a voltage source, referred to as $V_{SUPPLY}$ in FIG. 2. MOSFET device 231 is coupled at a gate terminal to control system 210. MOSFET device 231 is coupled at a source terminal to a drain terminal of MOSFET device 232, which is also an output node 215 of circuit 200. Output node 215 is coupled to a phase of a motor, shown as motor winding 250 in FIG. 2. Second MOSFET device 232 is coupled at a gate terminal to control system 210, and at a source terminal to a voltage reference (electrical ground) GND 2 274.

MOSFET device 241 is the "high-side" (HS) device of half-bridge 240, while MOSFET device 242 is the "low-side" (LS) device of half-bridge 240. Each power MOSFET device also has a corresponding body diode 243 and 244. MOSFET device 241 is coupled at a drain terminal to a voltage source, referred to as $V_{SUPPLY}$ in FIG. 2. MOSFET device 241 is coupled at a gate terminal to control circuitry not illustrated here for simplicity. MOSFET device 241 is coupled at a source terminal to a drain terminal of MOSFET device 242, which is also an output node 264 of circuit 200. Output node 264 is coupled to a phase of a motor, shown as motor winding 250 in FIG. 2. MOSFET device 242 is coupled at a gate terminal to control circuitry not illustrated here for simplicity, and at a source terminal to a voltage reference (electrical ground) GND 2 274.

The gate terminal of MOSFET device 231 and a gate terminal of MOSFET device 232 are coupled over associated links 214 and 218 to gate driver circuits 212 and 216 respectively. The common or shared node 215 in the half-bridge arrangement, also includes an output node for the half-bridge. In operation, the half-bridge arrangement provides power to motor winding 250 in the form of electrical current. This electrical current has two polarities, namely a positive and negative polarity indicated. A positive current polarity is referred to in FIG. 2 as an outgoing current from half-bridge 230 to motor winding 250, while a negative current polarity is referred to in FIG. 2 as an outgoing current from half-bridge 240 to motor winding 250. Various switch states among MOSFET devices 231, 232, 241, and 241 provide for sinking or sourcing the motor winding current and associated polarities. For example, when the first (high-side0 transistor 231 of half-bridge 230 is active, then current is supplied from $V_{SUPPLY}$ through MOSFET device 231 to motor winding 250. Likewise, when the second (low-side) transistor 232 of half-bridge 230 is active, the current is drawn to ground through MOSFET device 232.

Figure 3:
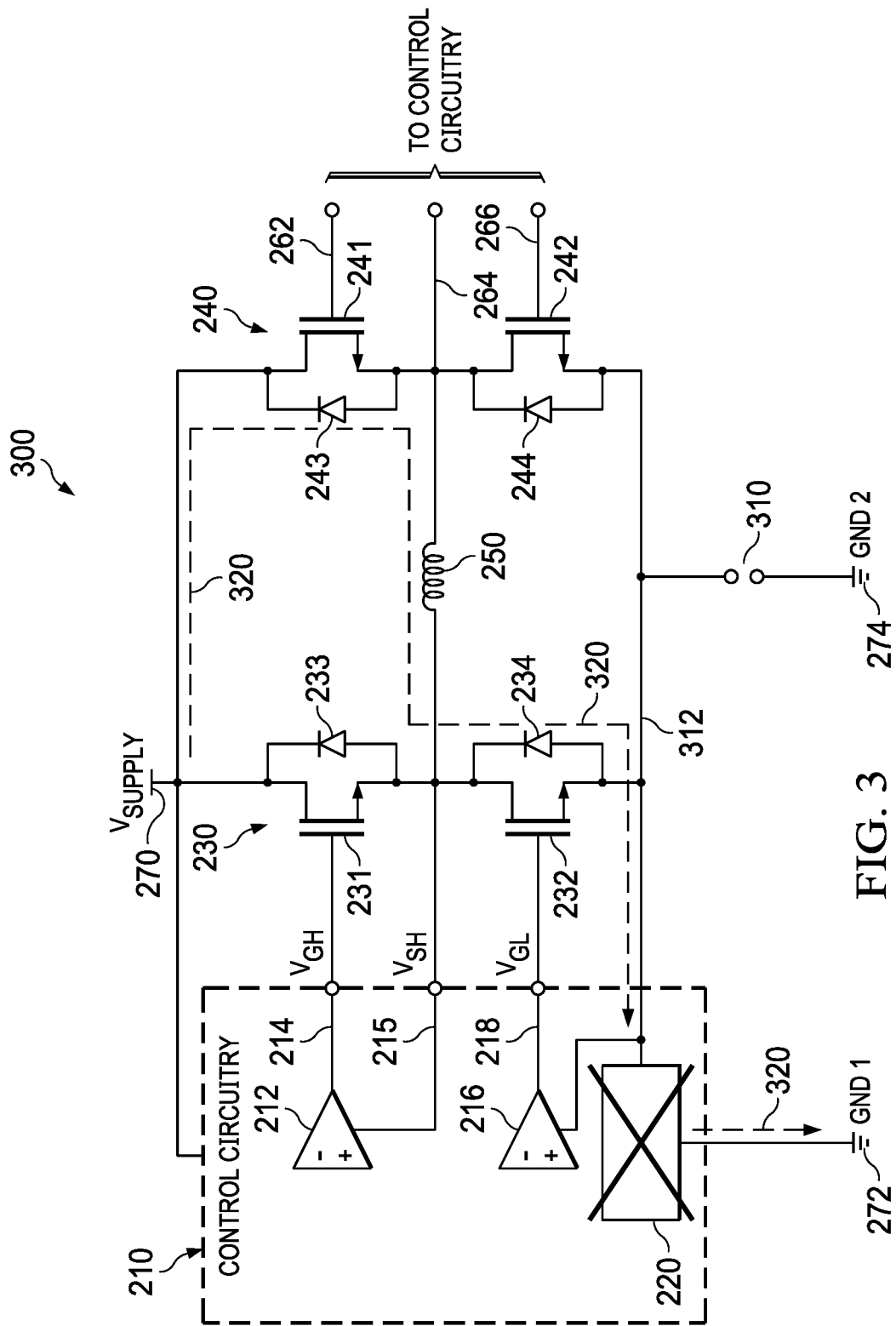
FIG. 3 illustrates a ground disconnection in a motor power control system in an example implementation.

FIG. 3 illustrates the control circuitry 210 and power circuitry 200 from FIG. 2 in the case where a disconnection 310 from GND 2 274 has occurred. In this example, node 312 is now disconnected from GND 2 274 while motor winding 250 is still being driven by half-bridges 230 and 240. A large current, illustrated by dashed line 320 now has no direct path to electrical ground. This causes the current 320 to flow through control circuitry 210. When the voltage differential between node 312 and GND 1 272 exceeds 10 volts, ESD Clamp 220 attempts to route the current from node 312 to GND 1 272. However, since control circuitry 210 is a low-power device, it is not capable of handling the amount of current required by power circuitry 300, and ESD Clamp 220 is destroyed, possibly along with other circuitry within control circuitry 210.

Figure 4:
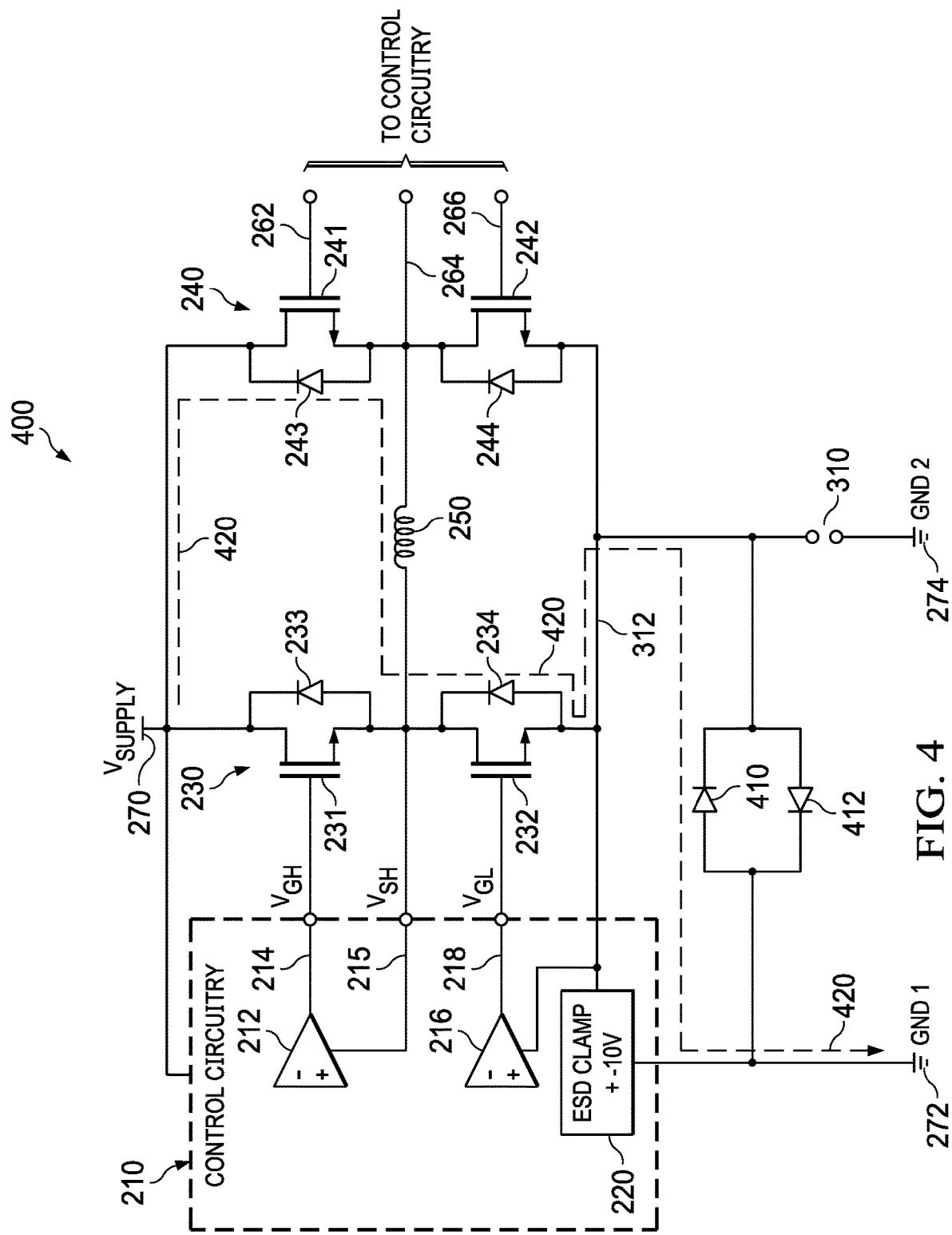
FIG. 4 illustrates ground disconnection protection circuitry for a motor power control system in an example implementation.

FIG. 4 illustrates the control circuitry 210 and power circuitry 200 from FIG. 3 along with ground disconnection protection circuitry configured to protect control circuitry 210. In this example, ground disconnection protection circuitry including back-to-back power diodes 410 and 412 have been added between GND 1 272 and GND 2 274 (before disconnection 310 occurs). In this example, a cathode terminal of power diode 410 and an anode terminal of power diode 412 are coupled to GND 2 274 (before disconnection 310 occurs), while an anode terminal of power diode 410 and a cathode terminal of power diode 412 are coupled to GND 1 272.

In operation, this example provides a common mode range of $V_{diode}$ or about 0.7 volts. After disconnection 310 occurs, when the voltage differential between GND 1 and node 312 exceeds 0.7 volts, either power diode 410 or power diode 412 will turn on (depending on the polarity of the voltage differential) and sink current from node 312 to GND 1 272. This current path is illustrated in FIG. 4 as dashed line 420.

Figure 5:
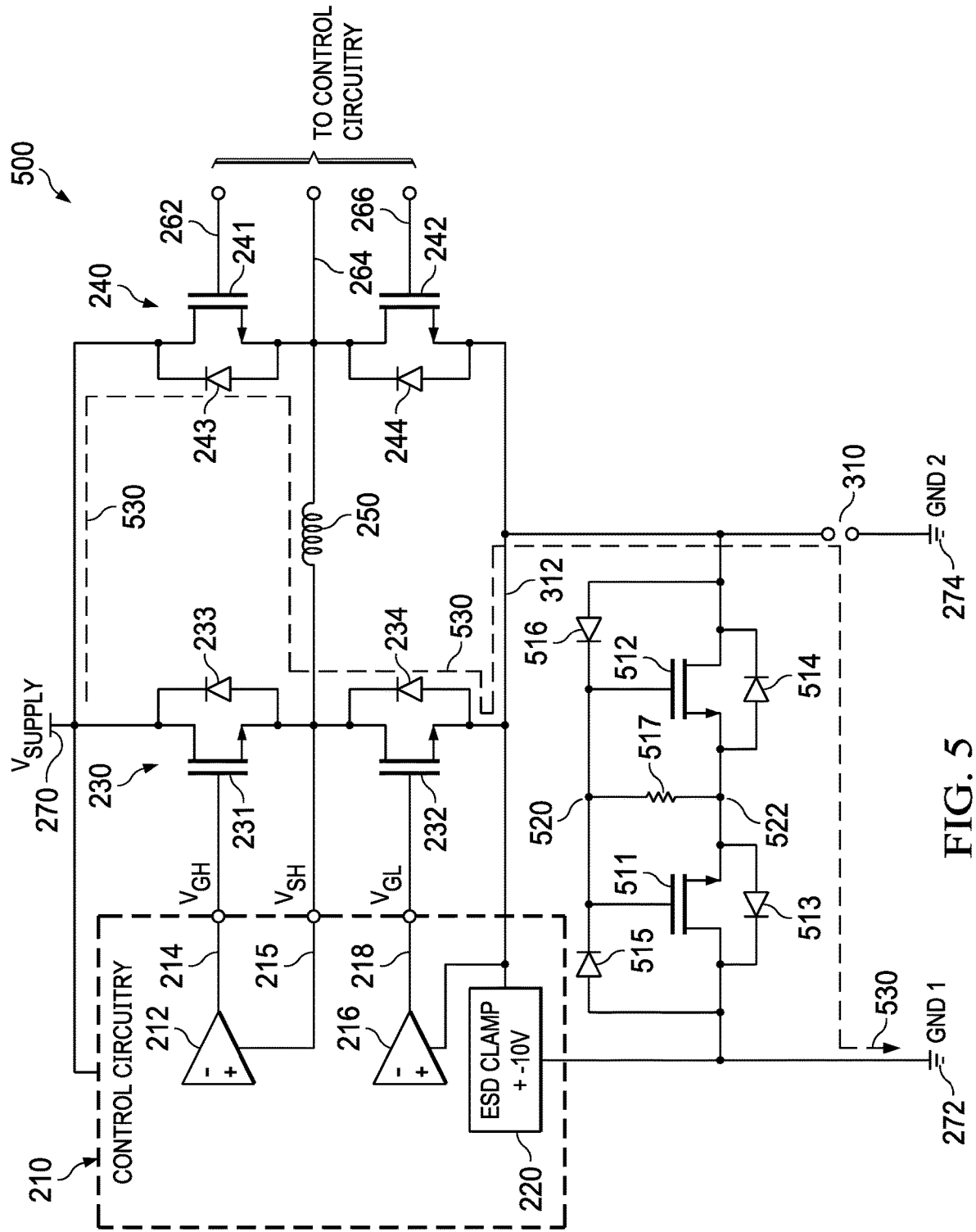
FIG. 5 illustrates ground disconnection protection circuitry for a motor power control system in an example implementation.

FIG. 5 illustrates the control circuitry 210 and power circuitry 200 from FIG. 3 along with ground disconnection protection circuitry configured to protect control circuitry 210. In this example, ground disconnection protection circuitry including power MOSFETs 511 and 512 are provided in a common-source arrangement between GND 1 272 and GND 2 274 (before disconnection 310 occurs). In this example, a source terminal of power MOSFET 511 is coupled with a source terminal of power MOSFET 512 at node 522. A drain terminal of power MOSFET 511 is coupled with GND 1 272, while a drain terminal of power MOSFET 512 is coupled with GND 2 274 (before disconnect 310 occurs). A gate terminal of power MOSFET 511 is coupled with a gate terminal of power MOSFET 512 at node 520. Power MOSFETs 511 and 512 each include body diodes 513 and 514 respectively.

In this example, the ground disconnection protection circuitry further includes two low-power diodes 515 and 516 and a gate low-power resistor 517 to provide gate biasing to the pair of power MOSFETs. A cathode terminal of diode 515 is coupled with the gate terminal (node 520) of power MOSFET 511, while an anode terminal of diode 516 is coupled with GND 1 272 (first ground). A cathode terminal of diode 516 is coupled with the gate terminal (node 520) of power MOSFET 512, while an anode terminal of diode 516 is coupled with GND 2 274 (second ground), (before disconnection 310 occurs.)

Diodes 515 and 516 effectively provide a logical OR function between GND 1 272 and GND 2 274 (or node 312 after disconnection 310 occurs). After disconnection 310 occurs, when the voltage differential between either node 312 or GND 1 272 and node 520 exceeds 0.7 volts, power MOSFETs 511 and 512 will turn on and sink current from node 312 to GND 1 272. This provides a baseline common mode range of 2*$V_{diode}$+$V_t$ of the power MOSFETs, roughly a little over 3 volts. Resistor 517 is coupled between nodes 520 and 522 in order to provide a low-current leakage path between the two nodes and acts to keep power MOSFETs 511 and 512 in an off state during normal operation. In an example, resistor 517 is a low-power resistor with a resistance of at least 10,000 ohms.

Compared to the circuit illustrated in FIG. 4, the baseline common mode range is improved, and this circuit allows for the extension of the common mode range by the addition of low cost, low-power components instead of costly high-power components. Examples of the extension of common mode range are shown in FIGS. 6A-6D.

Figure 6A:
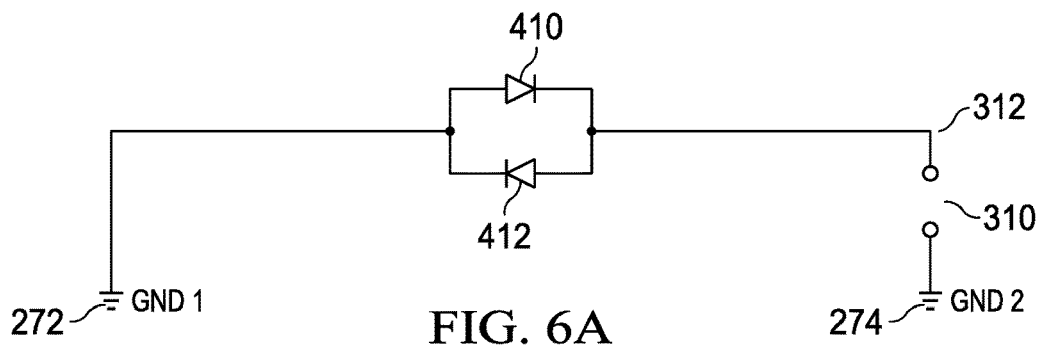
FIGS. 6A-6D illustrate ground disconnection protection circuitry for motor power control systems adapted for extended common mode range.

FIGS. 6A-6D illustrate an example of ground disconnection protection circuitry for motor power control systems adapted for extended common mode range. FIG. 6A illustrates the ground disconnection protection circuitry from FIG. 4 including power diodes 410 and 412 between GND 1 272 and GND 2 274 (before disconnection 310 occurs).

Figure 6B:
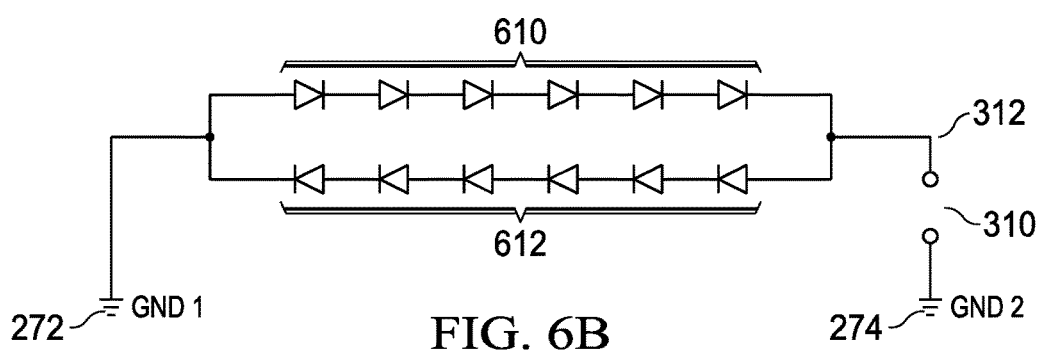

FIG. 6B illustrates the ground disconnection protection circuitry from FIG. 6A as modified to provide an extended common mode range of about 4 volts. In this example, in order to reach a common mode range of 4 volts, diode 410 has been replaced by 6 high-power diodes 610 coupled in series, and diode 412 has been replaced by 6 high-power diodes 612 also coupled in series, for a total of 12 high-power diodes. While the example solution works, high-power diodes are expensive, and require large amounts of space on the PCB.

Figure 6C:
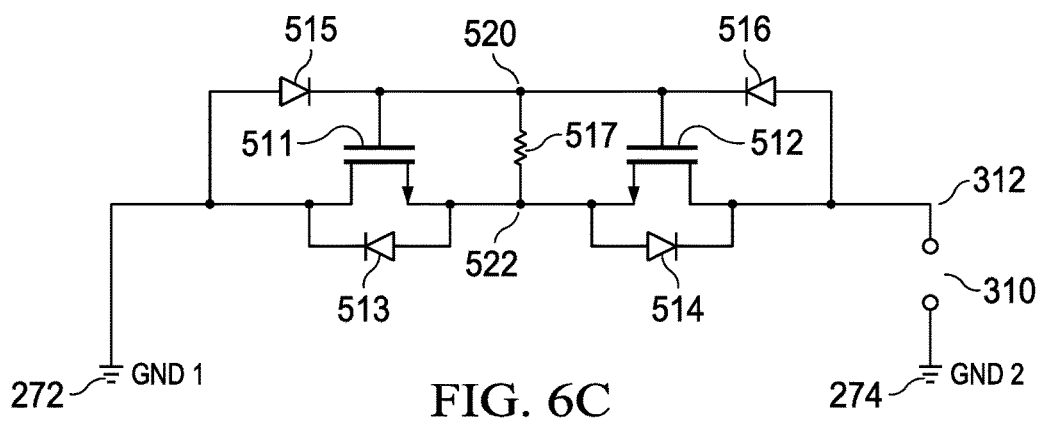

In contrast, FIG. 6C illustrates the ground disconnection protection circuitry from FIG. 5 including power MOSFETs 511 and 512 in a common-source arrangement between GND 1 272 and GND 2 274 (before disconnection 310 occurs). As discussed above, this configuration has a common mode power range of roughly a little over 3 volts.

Figure 6D:
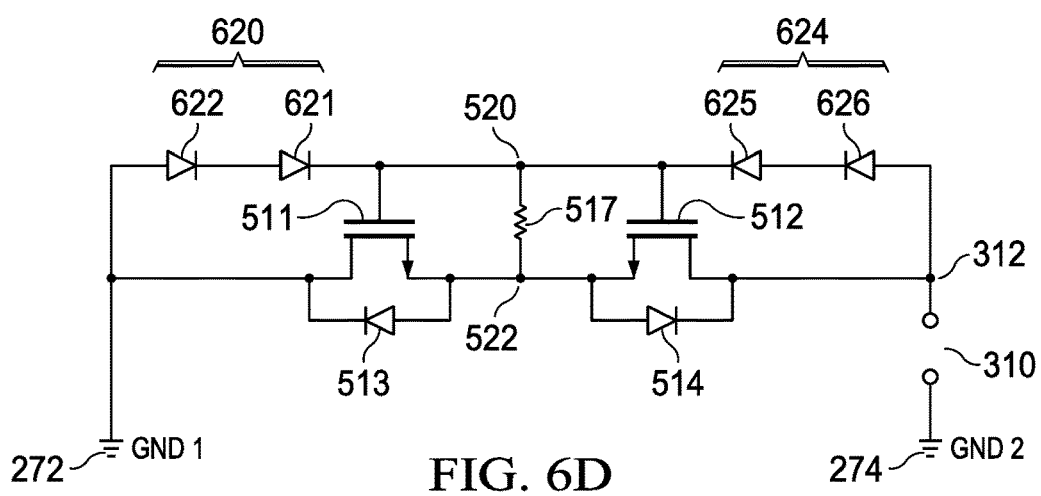

FIG. 6D illustrates the ground disconnection protection circuitry from FIG. 6C as modified to provide an extended common mode range of about 4 volts. In this example, in order to reach a common mode range of 4 volts, low-power diode 515 has been replaced by a pair of series diodes 620 including low-power diodes 621 and 622, and low-power diode 516 has been replaced by a pair of series diodes 624 including low-power diodes 625 and 626. Each pair of series diodes includes a first diode coupled at an anode terminal to a cathode terminal of a second diode. This configuration increases the common mode range by $V_{diode}$ or about 0.7 volts, to a total of roughly 4 volts.

In this example, the first pair of series diodes is coupled at a cathode terminal to a gate terminal of the first power MOSFET and a gate terminal of the second power MOSFET, and coupled at an anode terminal to the drain terminal of the first power MOSFET. The second pair of series diodes is coupled at a cathode terminal to the gate terminal of the second power MOSFET and the gate terminal of the first power MOSFET and coupled at an anode terminal to the drain terminal of the second power MOSFET.

In this example, the first pair of series diodes includes a first diode coupled at an anode terminal to a cathode terminal of a second diode. The cathode terminal of the first pair of series diodes is a cathode terminal of the first diode, and the anode terminal of the first pair of series diodes is an anode terminal of the second diode.

The second pair of series diodes comprises a third diode coupled at an anode terminal to a cathode terminal of a fourth diode. The cathode terminal of the second pair of series diodes is a cathode terminal of the third diode, and the anode terminal of the second pair of series diodes is an anode terminal of the fourth diode.

In an optional example, resistor dividers may be used to control the gate terminals of the power MOSFETs, however, this is not as efficient as adding additional low-power diodes to the circuit.

In contrast to the circuits illustrated in FIGS. 6A and 6B, the circuits of FIGS. 6C and 6D provide for the extension of the common mode range simply by the additions of low-power diodes in series. These low-power diodes are much smaller and less expensive than the high-power diodes required by the circuits of FIGS. 6A and 6B. In various other examples, the ground disconnection protection circuitry illustrated in FIG. 6D includes three or more series diodes in order to increase the common mode range of the circuit as desired.

What is claimed is:

1. A circuit comprising: a first power metal oxide semiconductor field-effect transistor (MOSFET) having a first drain terminal connected to a first ground, a first source terminal, and a first gate terminal; a second power MOSFET having a second drain terminal connected to a second ground, a second source terminal connected to the first source terminal, and a second gate terminal connected to the first gate terminal; a first diode having a first cathode connected to the first gate terminal, and having a first anode; a second diode having a second cathode connected to the first anode, and a second anode connected to the first drain terminal; a third diode having a third cathode connected to the second gate terminal, and having a third anode; a fourth diode having a fourth cathode connected to the third anode, and a fourth anode connected to the second drain terminal; and a resistor connected at a first terminal to the gate terminals of the first and second power MOSFETs, and connected at a second terminal to the source terminals of the first and second power MOSFETs.

2. The circuit of claim 1, in which the first and second power MOSFETs are n-channel power MOSFETs.

3. The circuit of claim 1, including:
   A fifth diode having a fifth cathode terminal coupled to the first drain terminal, and a fifth anode terminal coupled to the first source terminal;
   a sixth diode having a sixth cathode terminal coupled to the second drain terminal, and a sixth anode terminal coupled to the second source terminal.

4. The circuit of claim 1, in which the first, second, third and fourth diodes are configured to turn on the first and second power MOSFETS when the voltage difference between the first drain terminal and the second drain terminal exceeds a threshold.

5. The circuit of claim 1, wherein the resistor is configured to provide a leakage path between the first and second gate terminals, and to keep the first and second power MOSFETs off during normal operation when there is no ground disconnection event.

6. The circuit of claim 5, in which the resistor has a resistance of at least 10,000 ohms.

7. The circuit of claim 1, in which the first, second, third and fourth diodes are configured as a logical OR between the first ground and the second ground.

8. The circuit of claim 1, wherein the first, second, third and fourth second diodes and the resistor are low-power devices.

9. The circuit of claim 5, in which the first, second, third and fourth diodes are configured to turn on the first and second power MOSFETS when the voltage difference between the first drain terminal and the second drain terminal exceeds a threshold.

10. A circuit for ground disconnection protection in an electric motor, comprising:
- a first power metal oxide semiconductor field-effect transistor (MOSFET) having a first drain terminal coupled to a first ground, a first source terminal, and a first gate terminal;
- a second power MOSFET having a second drain terminal coupled to a second ground, a second source terminal coupled to the first source terminal, and a second gate terminal coupled to the first gate terminal; and
- a first pair of series diodes coupled at a cathode terminal to the first and second gate terminals, and coupled at an anode terminal to the first drain terminal;
- a second pair of series diodes coupled at a cathode terminal to the first and second gate terminals, and coupled at an anode terminal to the second drain terminal; and
- a resistor coupled at a first terminal to the first and second gate terminals, and coupled at a second terminal to the first and second source terminals;

wherein the first and second power MOSFETs are configured to turn on during a ground disconnection event in an electric motor system, allowing a current to pass between the first ground and the second ground.

11. The circuit of claim 10, further comprising:
- a first bypass diode having a first bypass cathode terminal coupled to the first drain terminal, and a first bypass anode terminal coupled to the first source terminal;
- a second bypass diode having a second bypass cathode terminal coupled to the second drain terminal, and a second bypass anode terminal coupled to the second source terminal.

12. The circuit of claim 10, wherein the resistor is configured to provide a leakage path between the first and second gate terminals, and to keep the first and second power MOSFETs off during normal operation when there is no ground disconnection event.

13. The circuit of claim 10, in which the resistor has a resistance of at least 10,000 ohms.

14. The circuit of claim 10, in which the first and second diode pairs are configured as a logical OR between the first ground and the second ground.

* * * * *